United States Patent
Lin et al.

(10) Patent No.: US 12,408,367 B2
(45) Date of Patent: Sep. 2, 2025

(54) SEMICONDUCTOR DEVICE

(71) Applicant: TAIWAN SEMICONDUCTOR MANUFACTURING CO., LTD., Hsinchu (TW)

(72) Inventors: Che-Yu Lin, Hsinchu (TW); Ming-Hua Yu, Hsinchu (TW); Tze-Liang Lee, Hsinchu (TW); Chan-Lon Yang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 21 days.

(21) Appl. No.: 18/353,875

(22) Filed: Jul. 17, 2023

(65) Prior Publication Data

US 2023/0378361 A1 Nov. 23, 2023

Related U.S. Application Data

(63) Continuation of application No. 17/074,287, filed on Oct. 19, 2020, now Pat. No. 11,749,756, which is a
(Continued)

(51) Int. Cl.
*H10D 30/62* (2025.01)
*H01L 21/02* (2006.01)
(Continued)

(52) U.S. Cl.
CPC ... *H10D 30/6211* (2025.01); *H01L 21/02057* (2013.01); *H01L 21/26513* (2013.01);
(Continued)

(58) Field of Classification Search
CPC ........... H01L 29/7851; H01L 29/66795; H01L 23/544; H01L 29/0649; H01L 29/7848;
(Continued)

(56) References Cited

U.S. PATENT DOCUMENTS 5,428,237 A   6/1995  Yuzurihara et al.
6,007,624 A   12/1999  Wise
(Continued)

FOREIGN PATENT DOCUMENTS

CN   103531477 A   1/2014
CN   104733390 A   6/2015
(Continued)

*Primary Examiner* — Moazzam Hossain
(74) *Attorney, Agent, or Firm* — Maschoff Brennan

(57) ABSTRACT

A device includes a fin structure, a gate structure, a first source/drain epitaxial structure and, a second source/drain epitaxial structure. The fin structure over a substrate and includes a bottom portion protruding from the substrate and a top portion over the bottom portion. An interface between the bottom portion and the top portion comprises oxygen and has an oxygen concentration lower than about 1.E+19 atoms/cm$^3$. The gate structure covers the fin structure. The first source/drain epitaxial structure and the second source/drain epitaxial structure are over the top portion of the fin structure and on opposite sides of the gate structure.

20 Claims, 15 Drawing Sheets

Related U.S. Application Data continuation of application No. 16/035,476, filed on Jul. 13, 2018, now Pat. No. 10,811,537, which is a continuation of application No. 14/954,661, filed on Nov. 30, 2015, now Pat. No. 10,026,843.

(51) Int. Cl.

| | | |
|---|---|---|
| *H01L 21/265* | (2006.01) | |
| *H01L 21/324* | (2006.01) | |
| *H01L 21/762* | (2006.01) | |
| *H01L 23/544* | (2006.01) | |
| *H10D 30/01* | (2025.01) | |
| *H10D 30/69* | (2025.01) | |
| *H10D 62/10* | (2025.01) | |
| *H10D 62/17* | (2025.01) | |
| *H10D 62/834* | (2025.01) | |

(52) U.S. Cl.
CPC ...... *H01L 21/324* (2013.01); *H01L 21/76224* (2013.01); *H01L 21/76229* (2013.01); *H01L 23/544* (2013.01); *H10D 30/024* (2025.01); *H10D 30/797* (2025.01); *H10D 62/115* (2025.01); *H10D 62/235* (2025.01); *H10D 62/834* (2025.01); *H01L 2223/54426* (2013.01); *H01L 2223/54453* (2013.01)

(58) Field of Classification Search
CPC ............... H01L 29/1033; H01L 29/167; H01L 2223/54453; H01L 2223/54426; H01L 21/76229; H01L 21/26513; H01L 21/324; H01L 21/02057; H01L 21/76224; H10D 30/6211; H10D 30/024; H10D 30/797; H10D 62/115; H10D 62/235; H10D 62/834; H10D 62/124; H10D 30/62; H10D 84/0158; H10D 30/6219; H10D 84/038

See application file for complete search history.

(56) References Cited

U.S. PATENT DOCUMENTS

| | | | |
|---|---|---|---|
| 8,497,171 B1 * | 7/2013 | Wu | H10D 84/038 |
| | | | 438/219 |
| 8,815,685 B2 | 8/2014 | LiCausi et al. | |
| 9,054,219 B1 | 6/2015 | Hoffman et al. | |
| 9,365,939 B2 | 6/2016 | Park et al. | |
| 2004/0065250 A1 * | 4/2004 | Komiya | C30B 15/00 |
| | | | 117/19 |
| 2004/0164334 A1 | 8/2004 | Masleid et al. | |
| 2007/0045748 A1 | 3/2007 | Booth, Jr. et al. | |
| 2007/0275516 A1 | 11/2007 | Eguchi et al. | |
| 2008/0113171 A1 | 5/2008 | Nakai et al. | |
| 2009/0184358 A1 | 7/2009 | Lenoble et al. | |
| 2010/0072515 A1 | 3/2010 | Park et al. | |
| 2010/0099231 A1 | 4/2010 | Siprak | |
| 2010/0099241 A1 | 4/2010 | Murano et al. | |
| 2010/0151169 A1 | 6/2010 | Dorawa et al. | |
| 2010/0151663 A1 | 6/2010 | Ohnuma et al. | |
| 2011/0163313 A1 | 7/2011 | Seacrist | |
| 2012/0306052 A1 | 12/2012 | Ono et al. | |
| 2013/0056794 A1 | 3/2013 | Nishikawa et al. | |
| 2013/0168744 A1 * | 7/2013 | Hsu | H10D 30/601 |
| | | | 257/288 |
| 2014/0042598 A1 | 2/2014 | Kitada et al. | |
| 2014/0120678 A1 | 5/2014 | Shinriki et al. | |
| 2014/0134779 A1 | 5/2014 | Kadano | |
| 2014/0213037 A1 | 7/2014 | LiCausi et al. | |
| 2014/0332850 A1 | 11/2014 | Park | |
| 2014/0374861 A1 | 12/2014 | Hoshi et al. | |
| 2015/0187914 A1 | 7/2015 | Basker et al. | |
| 2015/0222317 A1 | 8/2015 | Kuehn et al. | |
| 2015/0338709 A1 | 11/2015 | Yoshida | |
| 2016/0071979 A1 | 3/2016 | Jacob et al. | |
| 2016/0181311 A1 | 6/2016 | Kadono et al. | |
| 2016/0359022 A1 | 12/2016 | Balakrishnan et al. | |
| 2017/0011918 A1 | 1/2017 | Torigoe et al. | |

FOREIGN PATENT DOCUMENTS

| | | |
|---|---|---|
| CN | 104752229 A | 7/2015 |
| JP | H05167043 A | 7/1993 |

* cited by examiner

SEMICONDUCTOR DEVICE

CROSS-REFERENCE TO RELATED APPLICATION

This is a Continuation Applications of U.S. application Ser. No. 17/074,287, filed on Oct. 19, 2020, which is a Continuation Applications of U.S. application Ser. No. 16/035,476, filed on Jul. 13, 2018, now U.S. Pat. No. 10,811,537, issued on Oct. 20, 2020, which is a Continuation Applications of U.S. application Ser. No. 14/954,661, filed on Nov. 30, 2015, now U.S. Pat. No. 10,026,843, issued on Jul. 17, 2018, which is herein incorporated by reference in its entirety.

BACKGROUND

With the increasing down-scaling of integrated circuits and increasingly demanding want for the speed of integrated circuits, transistors have higher drive currents with smaller dimensions. Fin Field-Effect Transistors (FinFET) were thus developed. FinFET transistors have increased channel widths. The increase in the channel widths is achieved by forming channels that include portions on the sidewalls of the fins and portions on the top surfaces of the fins. Since the drive currents of transistors are proportional to the channel widths, the drive currents of FinFETs are increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
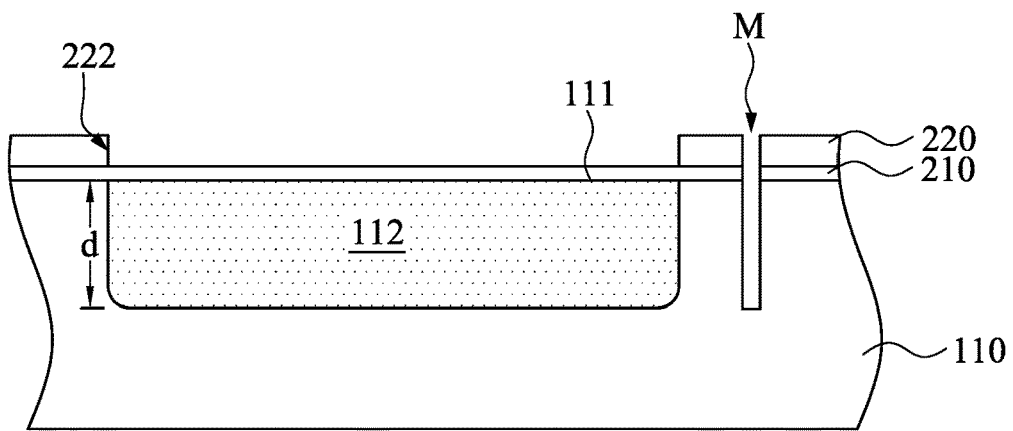
FIGS. 1A to 1G are cross-sectional views of a method for manufacturing a fin structure of a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide some methods for the formation of a fin structure of a semiconductor device and the resulting structure. As used herein, a "fin structure" refers to a semiconductor material, which is employed as a body of a field effect transistor, in which the gate dielectric and the gate are positioned around the fin structure such that charge flows down the channel on the two sides of the fin structure and optionally along the top surface of the fin structure. These embodiments are discussed below in the context of forming a fin structure of a finFET transistor having a single fin or multiple fins on a bulk silicon substrate. One of ordinary skill in the art will realize that embodiments of the present disclosure may be used with other configurations.

FIGS. 1A to 1G are cross-sectional views of a method for manufacturing a fin structure of a semiconductor device at various stages in accordance with some embodiments of the present disclosure. Reference is made to FIG. 1A. A substrate 110 is provided. In some embodiments, the substrate 110 may be made of a semiconductor material. The substrate 110 may include but are not limited to bulk silicon, bulk germanium, bulk silicon-germanium alloy, or bulk III-V compound semiconductor materials. In some embodiments, the substrate 110 includes bulk silicon that is undoped. Other materials that are suitable for semiconductor device formation may be used. Other materials, such as quartz, sapphire, and glass could alternatively be used for the substrate 110.

A screen layer 210 is formed on a top surface 111 of the substrate 110. The screen layer 210 can prevent the substrate 110 from being damaged by the following ion implantation. The screen layer 210 can be formed by a deposition process, such as chemical vapor deposition (CVD) and/or atomic layer deposition (ALD). CVD is a deposition process in which a deposited species is formed as a result of chemical reaction between gaseous reactants at greater than room temperature; wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. Alternatively, the screen layer 210 may be formed using a growth process, such as thermal oxidation or thermal nitridation. In some embodiments, the screen layer 210 is made of oxide, such as $SiO_2$, that is formed by CVD.

A patterned mask layer 220 is then formed on the screen layer 210 to be used as an ion implantation mask, and a mark M is formed in the substrate 110 through the screen layer 210 and the mask layer 220. The mark M may be formed using an etching process, and is configured to mark the position of the substrate 110. Hence, the position of an implanted region 112 can be determined in the substrate 110 according to the position of the mark M. In some embodiments, the mark M is a recess as shown in FIG. 1A. However, in some other embodiments, the mark M may be other suitable configurations, and the claimed scope is not limited in this respect.

In some embodiments, the patterned mask layer 220 may be a photoresist, and may be coated on the screen layer 210. The photoresist is then patterned to form the patterned mask layer 220 having an opening 222 that exposes an ion implantation area over the substrate 110. In doing so, the photoresist is patterned by exposure and development using a mask defining an ion implantation area, for example. In some other embodiments, the patterned mask layer 220 may be made of other suitable materials.

The top surface 111 of the substrate 110 is doped using a process, such as, ionized implantation to form the implanted region 112. The term of "ionized implantation" is a physical process in which dopant atoms are ionized and isolated, accelerated, formed into a beam and targeted onto the substrate 110. The ions penetrate the screen layer 210 and rest below the top surface 111 at a depth d, wherein the depth d is controlled by certain parameters. The depth d of the implanted region 112 can be from about 20 angstroms (Å) to about 200 Å. In some embodiments, the ion implantation cab be performed using an ion implantation apparatus wherein at least one ion of H, He, Ne, C, O, F, B, P or Si, including isotopes thereof, is used. In some embodiments, the semiconductor device described herein is a P-channel fin field effect transistor (finFET), such that the implanted region 112 is an N-well and dopant species may include phosphorus (P) or arsenic (As). In some other embodiments, the semiconductor device described herein is an N-channel finFET, such that the implanted region 112 is a P-well and dopant species may include boron (B). In some other embodiments, the dopants include germanium (Ge), xenon (Xe), argon (Ar), krypton (Kr), or combinations thereof. It is noted that other dopants are also contemplated and are within the scope of the disclosure. It should be noted that due to the nature of the implantation process, the boundaries of the implanted region 112 may be not sharp boundaries as shown in FIG. 1A but, instead, have gradual transitions.

Figure 1B:
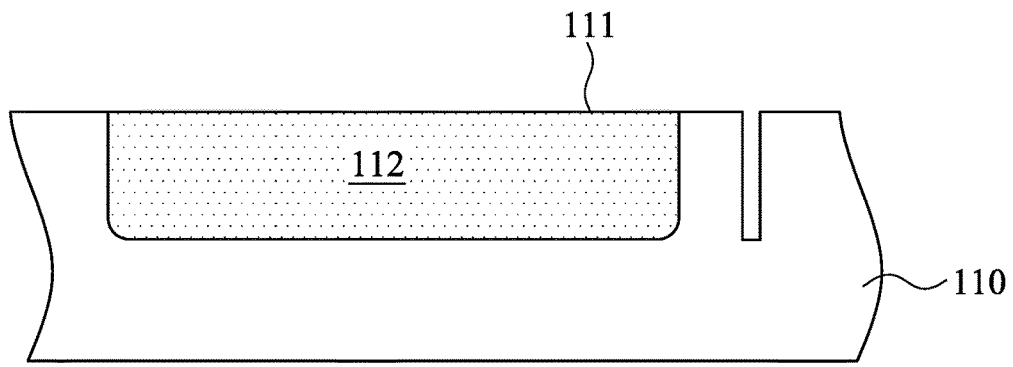

Reference is made to FIG. 1B. The implantation of ions into crystalline materials (such as crystalline silicon) may cause defects. In some embodiments, when the top surface 111 is oxidized, the oxygen ions may react with the dopants in the implanted region 112 and form oxide compound defects. Other defects may be vacancies and interstitials. Vacancies are crystal lattice points unoccupied by an atom. This is caused when an ion collides with an atom located in the crystal lattice, resulting in transfer of a significant amount of energy to the atom, allowing it to leave its crystal site. Interstitials result when these displaced atoms, or the implanted ions, come to rest in the solid, but do not find a vacant space in the lattice in which to reside. These point defects can migrate and cluster with each other, resulting in dislocation loops and other defects.

Figure 2:
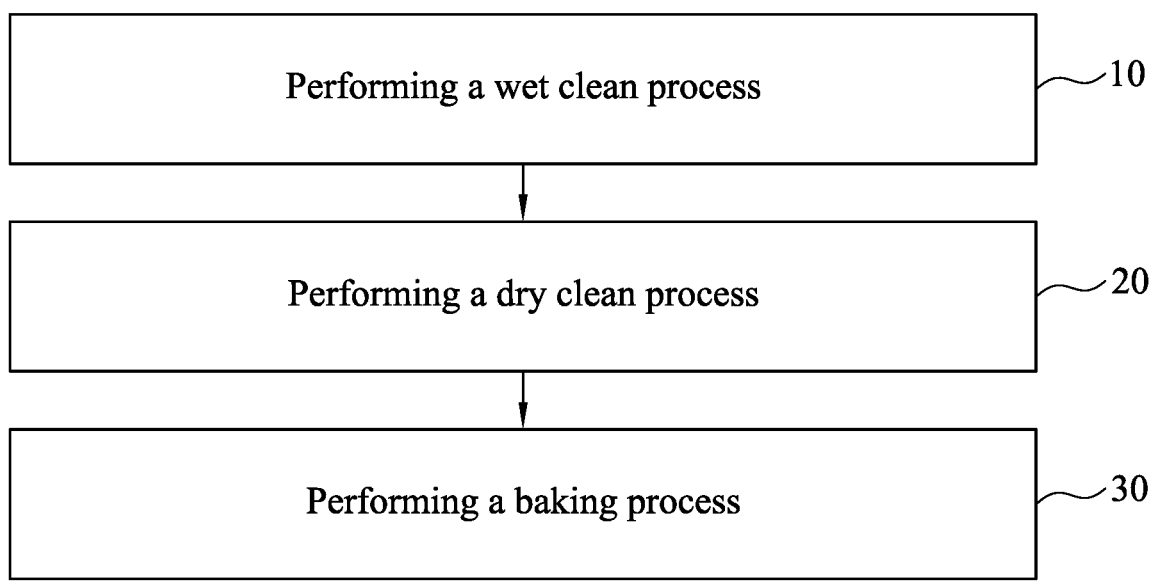
FIG. 2 is a flow chart of a surface treatment in accordance with some embodiments of the present disclosure.

To remove these defects (not shown), a surface treatment can be performed on the top surface 111 of the substrate 110. FIG. 2 is a flow chart of the surface treatment in accordance with some embodiments of the present disclosure. Reference is made to FIGS. 1B and 2. A wet clean process is performed to the top surface 111, as shown in operation 10. The wet clean process can remove the mask layer 220 and the screen layer 210 of FIG. 1A from the top surface 111 of the substrate 110. In some embodiments, a hydrofluoric acid (HF) mixture is used. The HF dip can use concentrated HF diluted in deionized ultrapure water with a water:HF ratio of between approximately 50:1 and 1000:1 (e.g., between substantially 100:1 and 500:1). The HF dip is performed at substantially room temperature for a period of between about 2 and about 10 minutes. In some embodiments, the HF dip can use a bath of water and HF. In some other embodiments, a water and HF rinse (e.g., using a spray tool) may be utilized.

Following a dry etching process is used to remove an oxide layer (not shown) on the top surface 111 of the substrate 110, as shown in operation 20. The oxide layer is often formed when exposing the substrate 110 to atmospheric conditions. The oxide layer is often referred to as a "native" oxide and may be removed using a variety of processes known to those of skill in the art. For example, the dry etching process may be used to remove the native oxide. In some embodiments, a Siconi etch may be performed. In other words, a fluorine-containing precursor and a hydrogen-containing precursor may be combined in a remote plasma region and excited in a plasma. The atomic flow ratio H:F during the Siconi etch may be between about 0.5:1 and about 8:1 to ensure the production of solid by-products on the exposed silicon surfaces. The native oxide is therefore consumed.

Alternatively, the native oxide can be removed by a hydrogen plasma formed in the substrate 110. The local plasma is created by applying a local plasma power above or about 200 Watts and below or about 3000 Watts or above or about 300 Watts and below or about 2000 Watts in embodiments. Regardless of the method used, the native oxide (if present) is removed before the operation of forming an epitaxial layer 120 (see FIG. 1C) on the substrate 110. Techniques for removing the native oxide may be carried out in the region of the substrate 110 used to form the epitaxial layer 120, or each of these processes may be performed in separate chambers. However, the substrate 110 should not be exposed to moisture or an atmospheric environment during the transfer between separate chambers.

Following a baking process is performed to further remove the defects on the top surface 111 of the substrate 110, as shown in operation 30. The baking process can remove native oxide on the top surface 111 in order to prevent crystal defects on the epitaxial structure 120 (see FIG. 1C) formed thereon. In some embodiments, the baking process is an in-situ baking process. In-situ means the baking process is performed in the process chamber for dry cleaning the top surface 111 of the substrate 110. In some other embodiments, the baking process can be performed in a different chamber (or ex-situ).

The baking process may be performed with the presence of hydrogen-containing gas. For example, the hydrogen-containing gas can be hydrogen gas. The baking temperature may be in a range from about 750° C. to about 900° C. In some other embodiments, the baking temperature may be in a range from about 800° C. to about 900° C. In some embodiments, the pressure of hydrogen gas may be between about 10 torr and about 200 torr. The baking duration may be between about 30 seconds and about 240 seconds, for example.

The terms "about" may be applied to modify any quantitative representation which could permissibly vary without resulting in a change in the basic function to which it is related. For example, the baking temperature as disclosed herein is in a range from about 750° C. to about 900° C. may permissibly having a baking temperature somewhat lower than 750° C. if the baking process is not physically altered.

Figure 3:
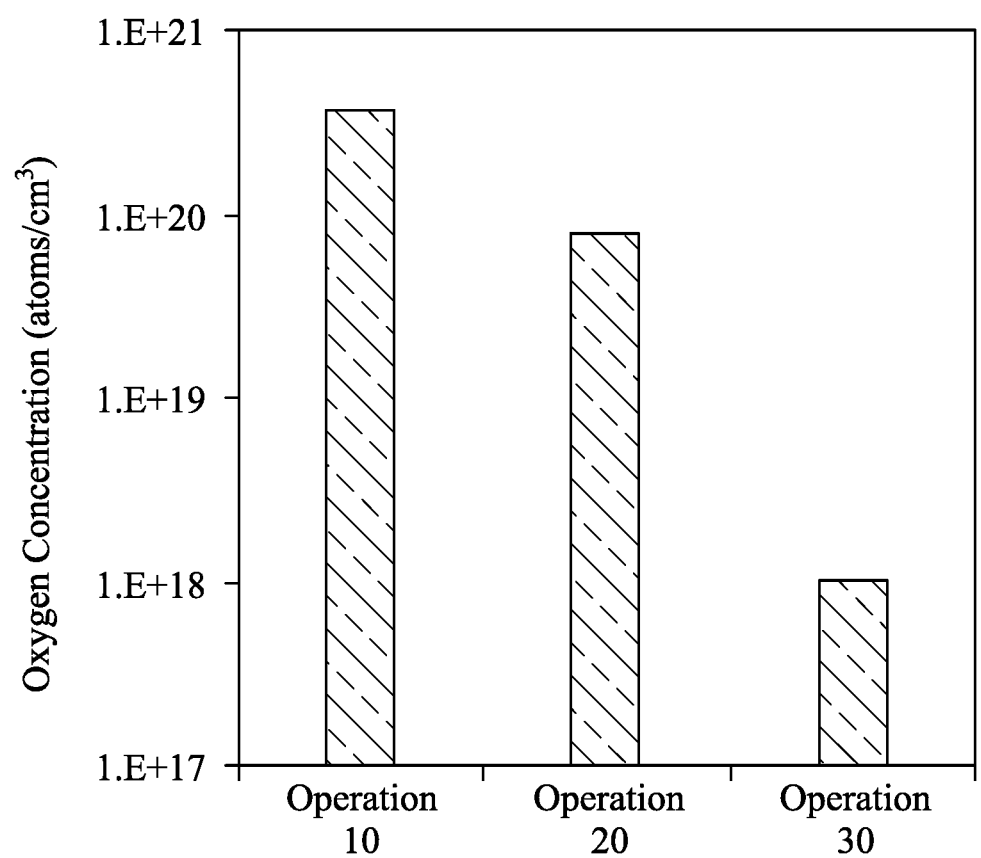
FIG. 3 is a graph of an oxygen concentration at an operation 10 (the wet clean process), an operation 20 (the dry clean process), and an operation 30 (the baking process) in FIG. 2.
Figure 4:
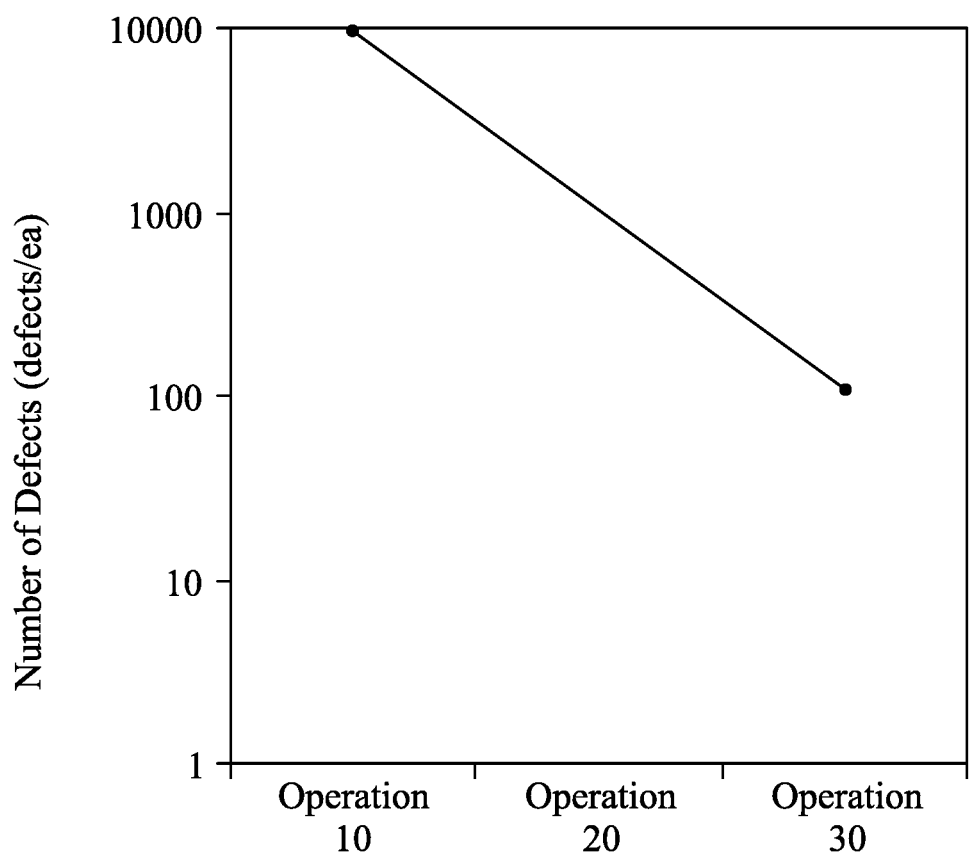
FIG. 4 is a graph of a number of defects on the top surface of the substrate at the operation 10 and the operation 30.

After the baking process, the oxygen concentration at the top surface 111 is reduced, such that the amount of defects on the top surface 111 is reduced. FIG. 3 is a graph of the oxygen concentration at the operation 10 (the wet clean process), the operation 20 (the dry clean process), and the operation 30 (the baking process). FIG. 4 is a graph of the number of defects on the top surface 111 at the operation 10 and the operation 30. In FIG. 3, the vertical axis of the graph shows the oxygen concentration (atoms/cm$^3$), and the horizontal axis shows operations. In FIG. 4, the vertical axis of the graph shows the amount of defects (defects/each (ea.)), and the horizontal axis shows operations. As shown in FIGS. 3 and 4, after the top surface 111 is baked, the oxygen concentration thereof is reduced, and the number of the defects is also reduced.

Figure 1C:
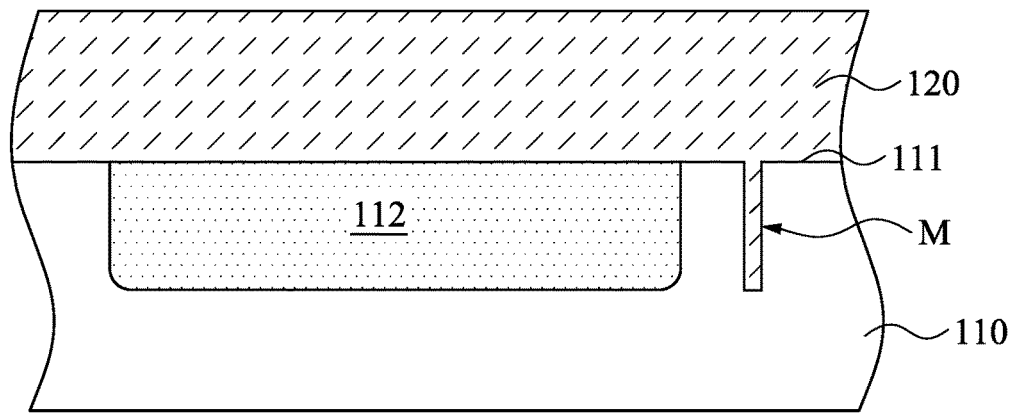

Reference is made to FIG. 1C. An epitaxial layer 120 is formed (or grown) on the top surface 111 of the substrate 110. Therefore, the top surface 111 is an interface of the epitaxial layer 120 and the substrate 110. In some embodiments, the forming process of the epitaxial layer 120 is an in-situ forming process. In-situ means the forming process is performed in the process chamber for baking the top surface 111 of the substrate 110. In some other embodiments, the forming process can be performed in a different chamber (or ex-situ). The epitaxial layer 120 also fills the mark M when the mark M is a recess.

The epitaxial layer 120 and the implanted region 112 can be an active layer of the semiconductor device. In some embodiments, the epitaxial layer 120 is undoped, and thus includes an intrinsic silicon layer. In some embodiments, the thickness of the epitaxial layer 120 is from about 50 m to about 200 m. In some other embodiments, the thickness is from about 75 m to about 150 m. In still some other embodiments, the thickness is from about 100 m to about 125 m.

In some embodiments, the epitaxial layer 120 is made of silicon. The epitaxial layer 120 may be deposited on the top surface 111 of the substrate 110 by a variety of methods known in the art of silicon wafer fabrication. Some exemplary methods of growing the epitaxial layer involve heating the substrate 110 to between about 1050° C. and about 1200° C. in a reaction vessel; purging the HCl gas from a reaction vessel; and reacting dichlorosilane and hydrogen gas in the reactor furnace to grow the epitaxial layer 120 at a growth rate of at least 5 m/minute. In some embodiments, trichlorosilane, tetrachlorosilane, or a number of other silane-based gases may optionally be used in place of dichlorosilane.

Figure 5:
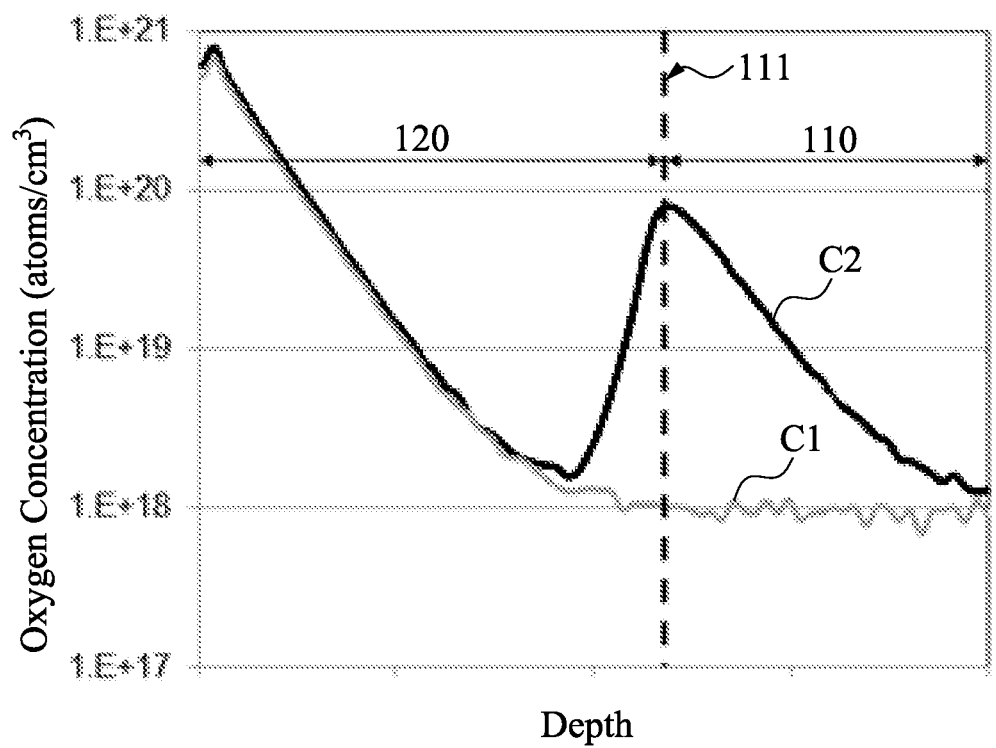
FIG. 5 is a graph of oxygen concentration curves of the structure in FIG. 1C with or without the treatment of the operation 30 (the baking process) in FIG. 2.

FIG. 5 is a graph of oxygen concentration curves of the structure in FIG. 1C with or without the treatment of the operation 30 (the baking process) in FIG. 2. The vertical axis of FIG. 5 shows the oxygen concentration (atoms/cm$^3$), and the horizontal axis shows the depth of the structure in FIG. 1C. Curve C1 represents the oxygen concentration along the depth with the baking process, and Curve C2 represents the oxygen concentration along the depth without the baking process. As shown in FIG. 5, when the baking process is omitted, the oxygen concentration at the interface (i.e., the top surface 111) was about 1.E+20 atoms/cm$^3$. With the performance of the baking process, the oxygen concentration at the interface was reduced and below about 1.E+19 atoms/cm$^3$. In FIG. 5, the oxygen concentration at the interface (i.e., the top surface 111) of the curve C1 was about 1.E+18 atoms/cm$^3$.

In FIG. 1C, since the top surface 111 of the substrate 110 is baked after the dry clean process, the number of defects in top surface 111 is reduced. Because of this low defect level in the top surface 111, when the epitaxial growth takes place on the substrate 110, the high quality epitaxial layer 120 can be formed without nucleation of extended defects, improving a dislocation problem that introduces unwanted and abrupt changes in electrical and optical properties.

Figure 1D:
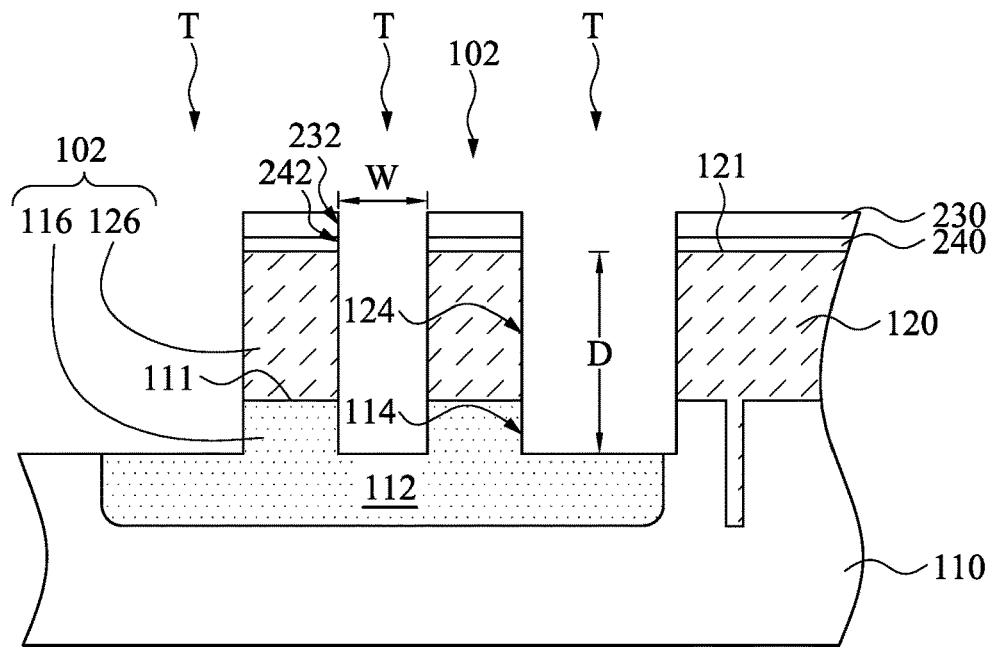

Reference is made to FIG. 1D. A patterned mask layer 230 and a protective layer 240 underneath formed over the top surface 121 of the epitaxial layer 120. The protective layer 240 protects the top surface 121 from direct contact with the mask layer 230. The protective layer 240 can be made of a thermal oxide, in some embodiments. The thickness of the protective layer 240 is in a range from about 20 nm to about 100 nm. The mask layer 230 assists maintaining the integrity of the patterns during etching of through holes 124. In some embodiments, the mask layer 230 is used as a planarization stop layer during the removal of excess dielectric film that fills the trenches T underneath. In some embodiments, the mask layer 230 is made of SiN. However, other materials, such as SiON, silicon carbide, or combinations thereof, may also be used. The thickness of the mask layer 230 is in a range from about 200 nm to about 1200 nm. The mask layer 230 may be formed by a process such as CVD, plasma enhanced chemical vapor deposition (PECVD), or LPCVD. Alternatively, the mask layer 230 may be first made of a silicon oxide and then converted to SiN by nitridation. Once formed, the hard mask layer 230 and the protective layer 240 are patterned through suitable photolithographic and etching processes to form the openings 232 and 242 over the top surface 121 for the trenches T.

Then, a plurality of trenches T are formed in the epitaxial layer 120 and the substrate 110 through the openings 232 and 242. Adjacent two of the trenches T define a semiconductor fin 102 therebetween. The semiconductor fin 102 includes an epitaxial fin portion 126 formed of the epitaxial layer 120 and a bottom fin portion 116 formed of the implanted region 112 of the substrate 110. The trenches T may be formed by using etching process, such as reactive ion etching (RIE). It is noted that although there are two semiconductor fins 102 in FIG. 1D, the claimed scope of the present disclosure is not limited in this respect. In some other embodiments, a person having ordinary skill in the art can manufacture suitable number of the semiconductor fins 102 of the semiconductor device according to actual situations. In some embodiments, the trenches T have a width W in a range from about 20 nm to about 100 nm. In some embodiments, the depth D of the trenches T is in a range from about 50 nm to about 350 nm. In some embodiments, an aspect ratio, the depth D divided by the width W, is in the range of about 5 to about 10.

Figure 1E:
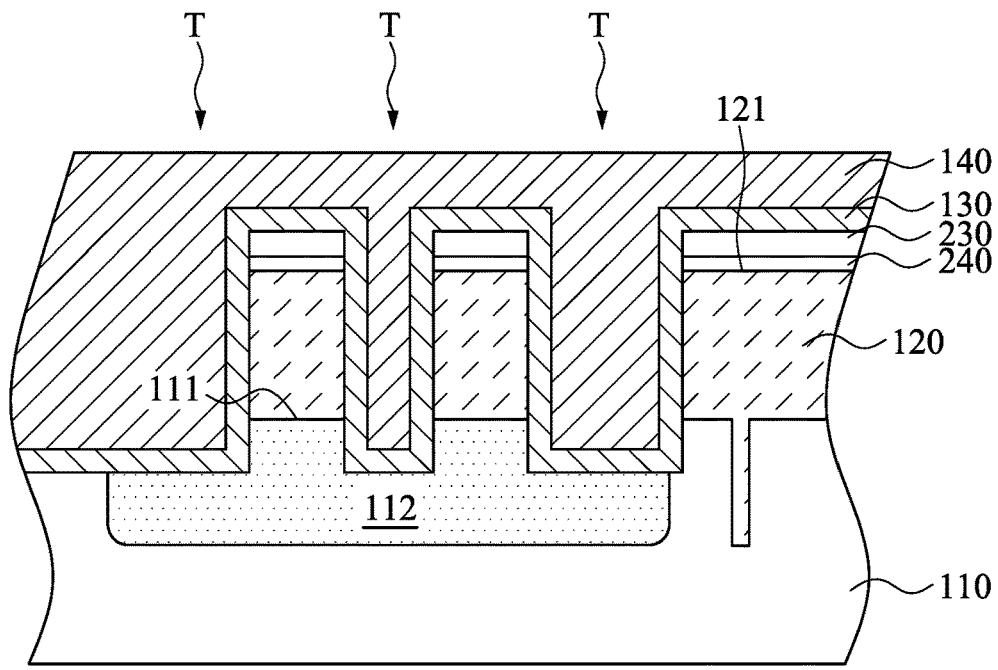

Reference is made to FIG. 1E. A liner layer 130 is then conformally formed in the trenches T. The liner layer 130 provides stress relief during thermal anneal(s) of the dielectric film (to be described below). In some embodiments, the liner layer 130 includes amorphous silicon or polysilicon. A thickness of the liner layer 130 can be between about 10 Å to about 40 Å. The liner layer 130 may be formed by using a furnace system in a gaseous environment containing $Si_2H_6$, $SiH_6$, $SiCl_2H_2$, or $SiCl_3H$. In some embodiments, the flow rate of $Si_2H_6$ can be in the range of about 10 standard cubic centimeters per minutes (sccm) to about 1000 sccm. A temperature for the formation of the liner layer 130 is in a rage of about 200° C. to about 600° C. A pressure range for the formation of the silicon liner layer 130 is from about 10 m Torr to about 10 Torr. Alternatively, the liner layer 130 may be formed by using a deposition technique that can form a conformal silicon layer, such as the low temperature chemical deposition process in a gaseous environment containing $Si_3H_8$, $SiH_4$, $SiCl_2H_2$ or $SiCl_3H$. The gas environment also includes a carrier gas such as hydrogen. The carrier gas helps to good control treatment uniformity. In some embodiments, the flow rates of $Si_3H_8$ and hydrogen can be in the range of about 10 sccm to about 1000 sccm, and of about 5 standard liters per minute (slm) to about 50 slm, respectively. A temperature for the formation of the liner layer 130 in the chemical deposition process is in a range of about 250° C. to 550° C.

In some other embodiments, the liner layer 130 is thermally grown on the sidewalls of the trenches T. The epitaxial layer 120 and the substrate 110 are exposed to an oxygen-containing environment at a high temperature and the surfaces exposed to the oxygen are converted to oxide layers. In some embodiments, the oxygen-containing environment includes steam. The liner layer 130 may include an additional layer or layers over the thermally grown silicon oxide layer. In some embodiments, an additional oxide layer may be deposited using plasma enhanced atomic layer deposition (PEALD). According to various embodiments, the liner layer 130 is formed to protect the epitaxial layer 120 and the substrate 110 underlying the liner layer 130 from subsequent oxidation.

After the deposition of the liner layer 130, a dielectric material overfills the trenches T and the mask layer 230 to form a dielectric layer 140. In some embodiments, the dielectric material is flowable. The dielectric layer 140 can be formed by using a spin on dielectric (SOD) formation process, or by depositing a dielectric by a CVD process, such as radical-component CVD. The examples, of precursors, include a silicate, a siloxane, a methyl SilsesQuioxane (MSQ), a hydrogen SisesQuioxane (HSQ), an MSQ/HSQ, a perhydrosilazane (TCPS), a perhydro-polysilazane (PSZ), a tetraethyl orthosilicate (TEOS), or a silyl-amine (SA).

In some embodiments, the dielectric layer 140 is deposited by using a silicon-containing precursor to react with another precursor, such as a "radical-nitrogen" precursor generated by a plasma. In some embodiments, the silicon-containing precursor is carbon-free and includes silyl-amines, such as $H_2N(SiH_3)$, $HN(SiH_3)_2$, $N(SiH_3)_3$, or combinations thereof. The silyl-amines may be mixed with additional gases that may act as carrier gases, reactive gases, or both. Examples of the additional gases may include $H_2$, $N_2$, $NH_3$, He, and Ar, among other gases. Silyl-amines may also be mixed with other carbon-free silicon-containing gas(es), such as silane ($SiH_4$) and disilane ($Si_2H_6$), hydrogen (e.g. $H_2$), and/or nitrogen (e.g. $N_2$, $NH_3$).

The deposition of the dielectric layer 140 may proceed while the temperature of the substrate 110 and the epitaxial layer 120 is maintained at a relative low temperature. In some embodiments, the dielectric layer 140 is deposited above the top surface 121 of the epitaxial layer 120 at low temperature which is maintained by cooling the substrate 110 and the epitaxial layer 120 during the deposition. In some embodiments, the deposition is performed at a temperature in a range from about −40° C. to about 200° C. In some embodiments, the deposition is performed at a temperature less than about 100° C.

In some embodiments, the deposition pressure is in a range from about 100 mTorr to about 10 Torr. In some embodiments, reaction source uses a gaseous environment containing trisilylamine ($Si_3H_9N$, or TSA) and $NH_3$. In some embodiments, the flow rates of $Si_3H_9N$ and $NH_3$ are in the range of about 100 sccm to about 1000 sccm, and of about 100 sccm to about 2000 sccm, respectively.

After the deposition process, a curing process is performed on the dielectric layer 140. In some embodiments, the curing process is operated in a flow rate of $O_3$ in the range of about 100 standard cubic centimeters per minute (sccm) to about 5000 sccm. A temperature for the curing process is in a range of about 10° C. to about 500° C. A pressure range for the curing process is from about 1 Torr to about 760 Torr.

Subsequently, an anneal process is performed. The anneal process could further densify and improve the quality of the dielectric layer 140. In some embodiments, the anneal process is performed in an environment containing steam in a flow rate of about 5 sccm to about 20 sccm. The anneal process is at a temperature in a range of about 1000° C. to about 1200° C. The anneal process starts at about 200° C. and ramps up the temperature gradually to a predetermined temperature of about 1000° C. to about 1200° C. During annealing the dielectric layer 140 can shrink as it densifies.

Figure 1F:
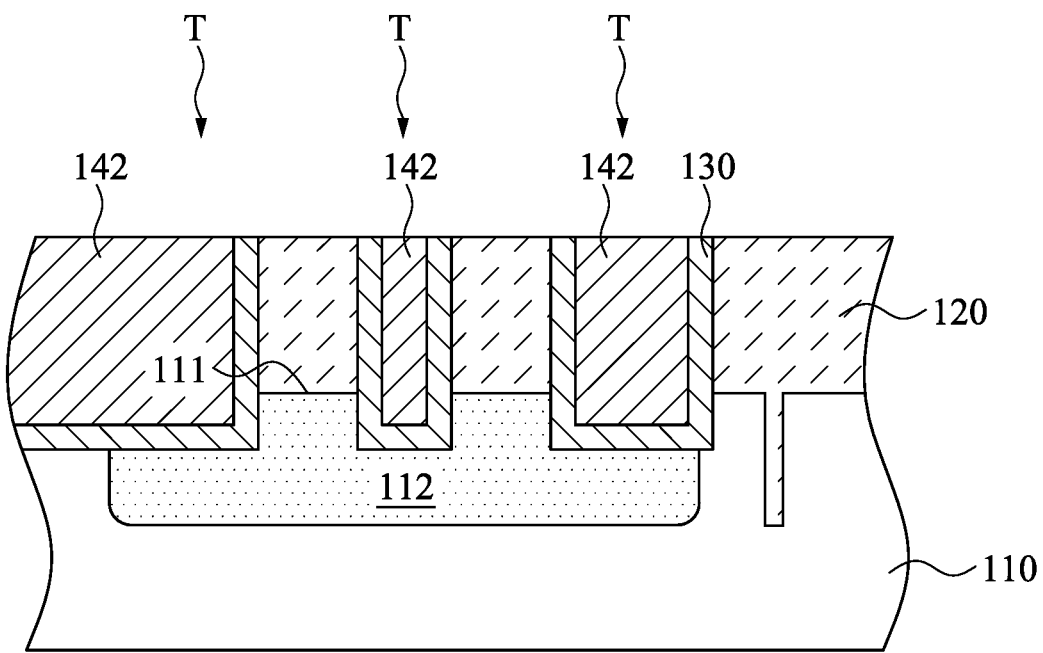

Reference is made to FIG. 1F. The excess dielectric layer 140 (see FIG. 1E) outside the trenches T and the mask layer 230 (see FIG. 1E) is removed to form isolation layers 142 in the trenches T through a process such as chemical mechanical polishing (CMP), an etch, or combinations thereof. In some embodiments, the removal process also removes the protective layer 240 of FIG. 1E. In some other embodiments, the removal process removes the mask layer 230 of FIG. 1E; however, the protective layer 240 is removed by an etching process.

Figure 1G:
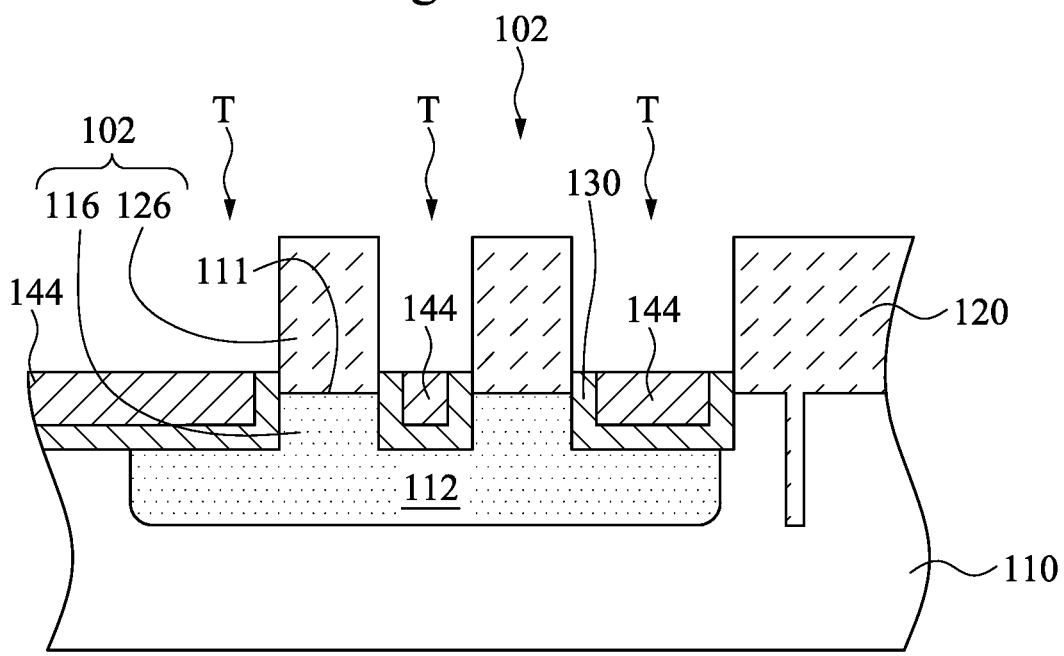

Reference is made to FIG. 1G. An etching process is performed to remove the portions of the isolation layers 142 of FIG. 1F until a predetermined depth is reached and form the isolation structures 144. The semiconductor fins 102 then protrude higher than the isolation structures 144. The etching process may also etch the liner layer 130 on the sidewalls of the semiconductor fins 102. The top surface 111 (i.e., the interface of the epitaxial layer 120 and the substrate 110) of the substrate 110 is therefore lower than the isolation structures 144.

In some embodiments, the etching process may be a dry etching process to etch the isolation layers 142 of FIG. 1F until a predetermined depth is reached. The process gas used in the dry etching process may include hydrogen atoms, for example, using hydrofluoric (HF) and ammonia ($NH_3$) based process gases to etch the isolation layers 142.

Figure 6A:
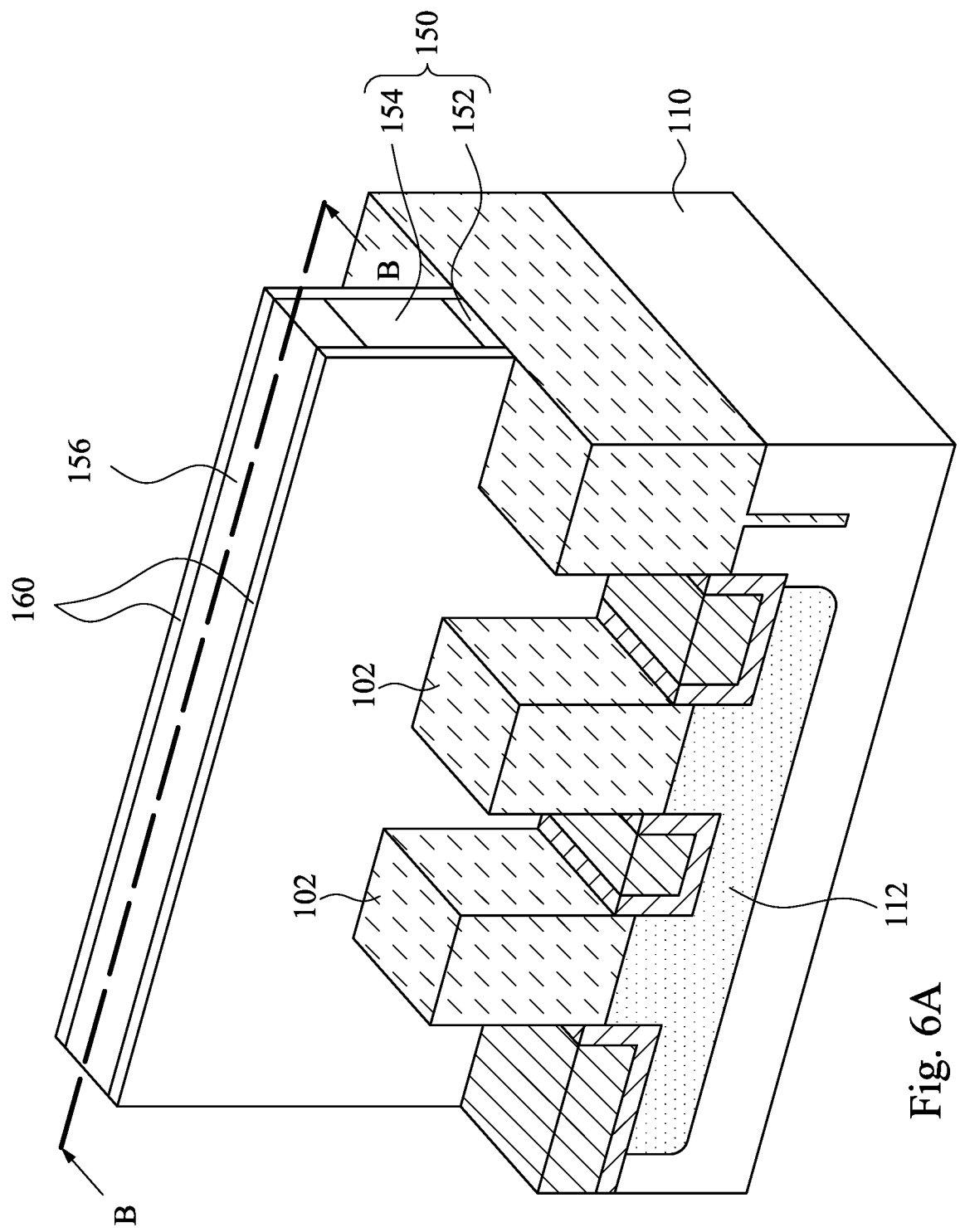
FIGS. 6A, 7, 8, and 9A are perspective views of a method for manufacturing a semiconductor device using the fin structure of FIG. 1G at various stages in accordance with some embodiments of the present disclosure.
Figure 6B:
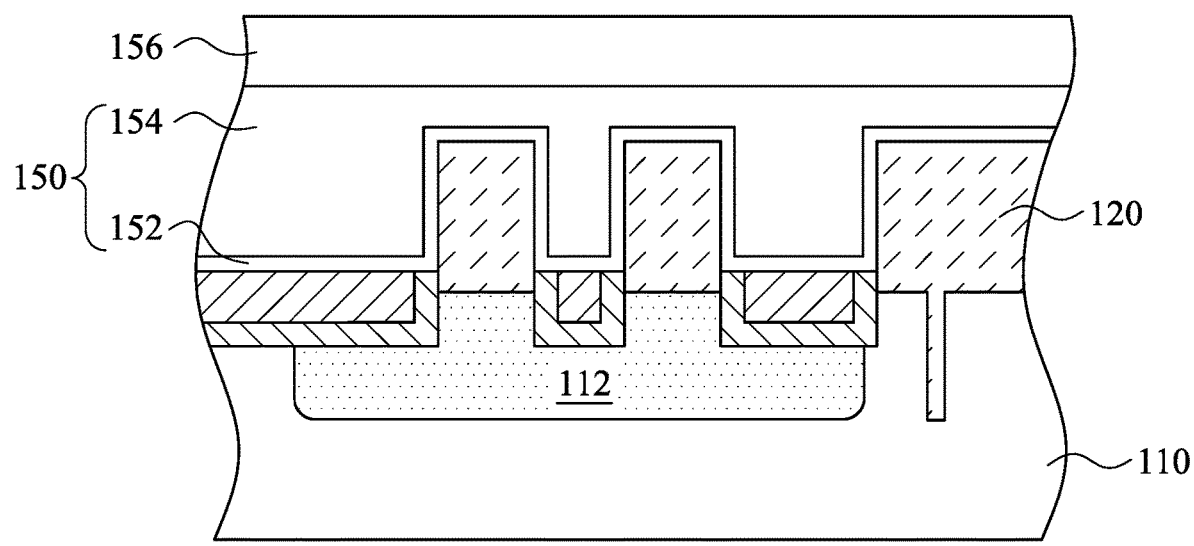
FIG. 6B is across-sectional view of the semiconductor device of FIG. 6A in some embodiments.

FIGS. 6A, 7, 8, and 9A are perspective views of a method for manufacturing a semiconductor device using the fin structure of FIG. 1G at various stages in accordance with some embodiments of the present disclosure, and FIG. 6B is a cross-sectional view of the semiconductor device of FIG. 6A in some embodiments. Reference is made to FIGS. 6A and 6B, where FIGS. 6B and 1G have substantially the same cross-sectional position. A gate stack 150 is formed on portions of the semiconductor fins 102 and exposes other portions of the semiconductor fins 102. The portions of the semiconductor fins 102 covered by the gate stack 150 form channel features, and the other portions of the semiconductor fins 102 uncovered by the gate stack 150 form source/drain features.

The gate stack 150 includes a gate insulator layer 152 and a gate electrode layer 154. The gate insulator layer 152 is disposed between the gate electrode layer 154 and the substrate 110, and is formed on the semiconductor fins 102. The gate insulator layer 152, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate insulator layer 152 may have a multilayer structure such as one layer of silicon oxide (e.g., interfacial layer) and another layer of high-k material. The gate insulator layer 152 may be formed using chemical vapor deposition (CVD), physical vapor deposition (PVD), atomic layer deposition (ALD), thermal oxide, ozone oxidation, other suitable processes, or combinations thereof.

The gate electrode layer 154 is formed over the substrate 110 to cover the gate insulator layer 152 and the portions of the semiconductor fins 102. In some embodiments, the gate electrode layer 154 includes a semiconductor material such as polysilicon, amorphous silicon, or the like. The gate electrode layer 154 may be deposited doped or undoped. For example, in some embodiments, the gate electrode layer 154 includes polysilicon deposited undoped by low-pressure chemical vapor deposition (LPCVD). Once applied, the polysilicon may be doped with, for example, phosphorous ions (or other P-type dopants) to form a PFET device or boron (or other N-type dopants) to form an NFET device. The polysilicon may also be deposited, for example, by furnace deposition of an in-situ doped polysilicon. Alternatively, the gate electrode layer 154 may include a polysilicon metal alloy or a metal gate including metals such as tungsten (W), nickel (Ni), aluminum (Al), tantalum (Ta), titanium (Ti), or any combination thereof.

In some embodiments, on top of the gate electrode layer 154, there is a hard mask layer 156, which is used with photoresist to pattern the gate stack 150. The hard mask layer 156 can be made of oxide, nitride, or a combination of oxide and nitride (dual-layer hard mask).

In FIG. 6A, a pair of dielectric layers 160 are formed over the substrate 110 and along the side of the gate stack 150 and the hard mask layer 156. In some embodiments, the dielectric layers 160 may include silicon oxide, silicon nitride, silicon oxy-nitride, or other suitable material. The dielectric layers 160 may include a single layer or multilayer structure. A blanket layer of the dielectric layers 160 may be formed by CVD, PVD, ALD, or other suitable technique. Then, an anisotropic etching is performed on the blanket layer to form a pair of the dielectric layer 160 on two sides of the gate stack 150. In some embodiments, the dielectric layers 160 are used to offset subsequently formed doped regions, such as source/drain regions. The dielectric layers 160 may further be used for designing or modifying the source/drain region (junction) profile.

Figure 7:
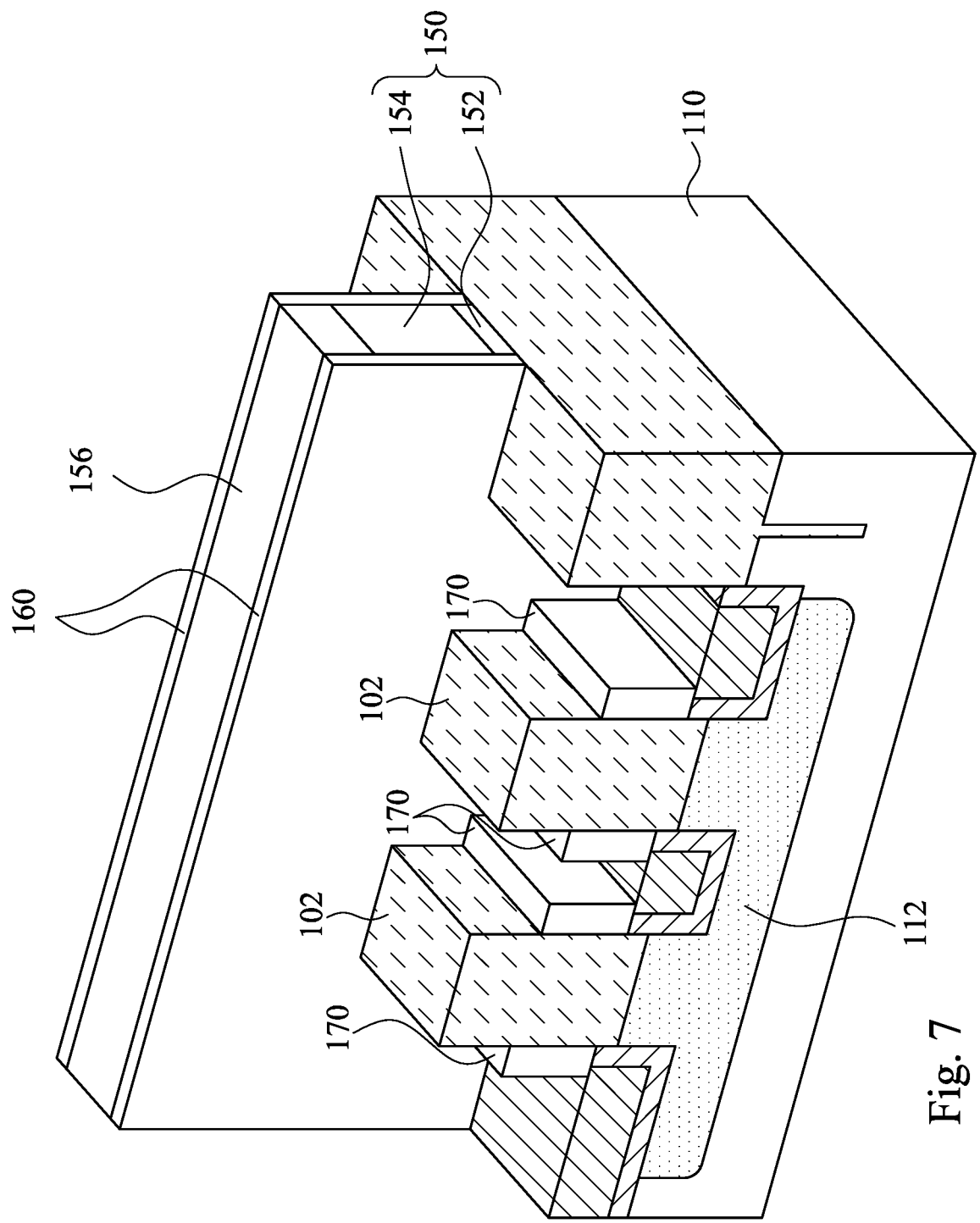

Reference is made to FIG. 7. A plurality of sidewall spacers 170 are formed along the semiconductor fins 102. The sidewall spacers 170 may include a dielectric material such as silicon oxide. Alternatively, the sidewall spacers 170 may include silicon nitride, SiC, SiON, or combinations thereof. The formation methods for the sidewall spacers 170 include depositing a dielectric material over the semiconductor fins 102, and then anisotropically etching back the dielectric material. The etching back process may include a multiple-step etching to gain etch selectivity, flexibility and desired overetch control.

Figure 8:
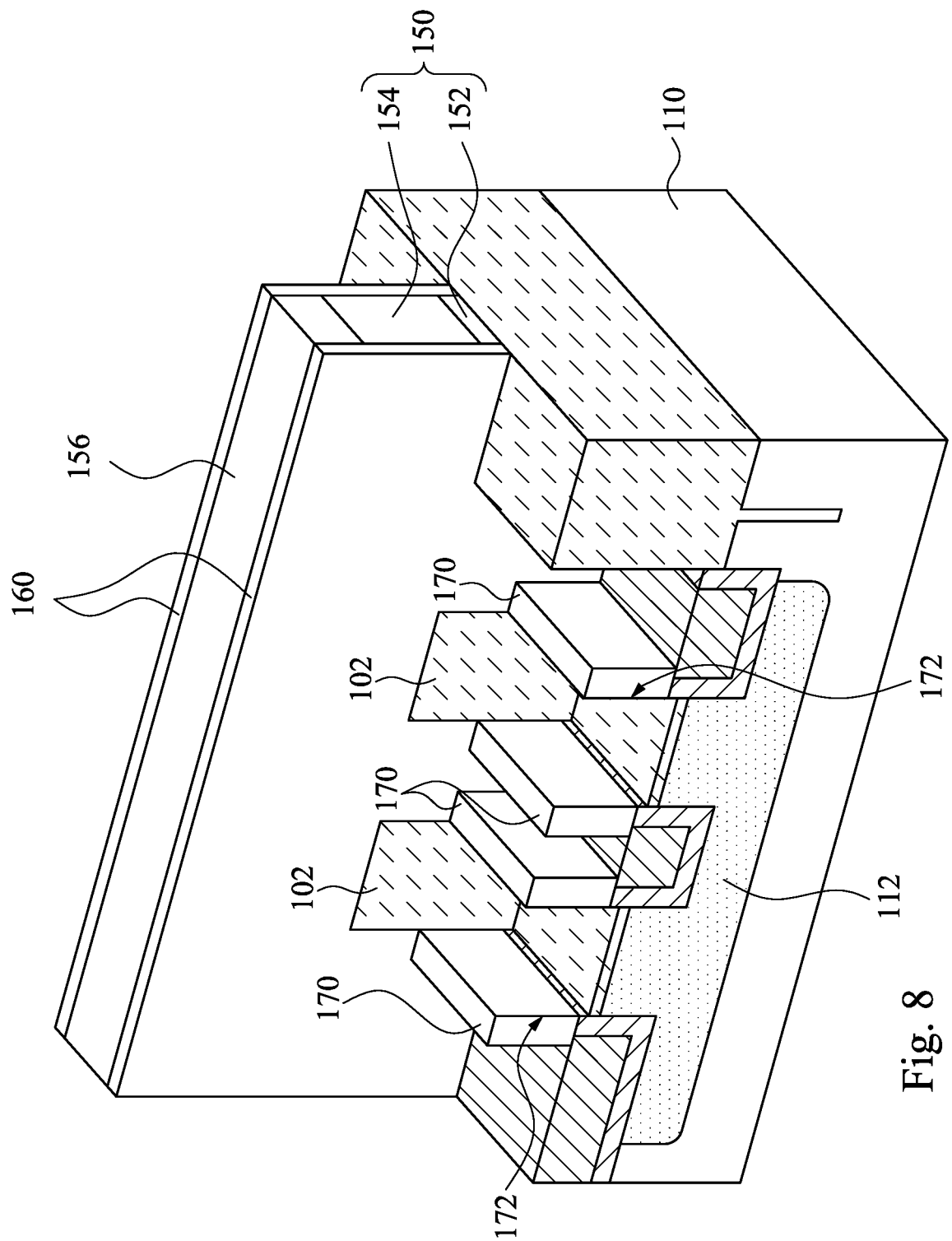

Reference is made to FIG. 8. Portions of the semiconductor fins 102 exposed by the gate stack 150 and the dielectric layers 160 are removed (or recessed) to form recessing trenches 172. In some embodiments, the recessing trenches 172 are formed with the sidewall spacers 170 as their upper portions. In some embodiments, sidewalls of the recessing trenches 172 are substantially and vertical parallel to each other. In some other embodiments, the recessing trenches 104 are formed with a non-vertical parallel profile.

The recessing process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 9A:
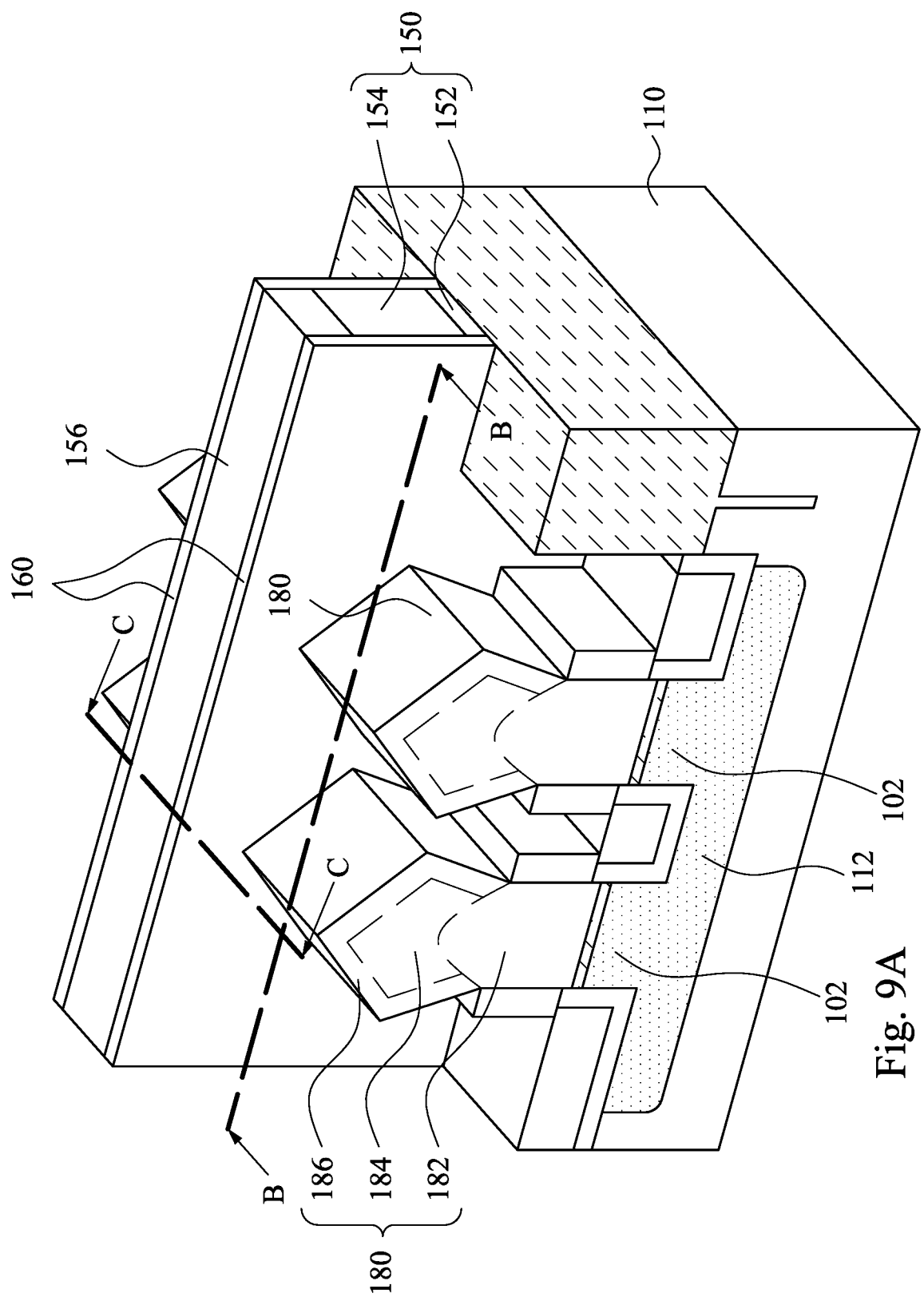
Figure 9B:
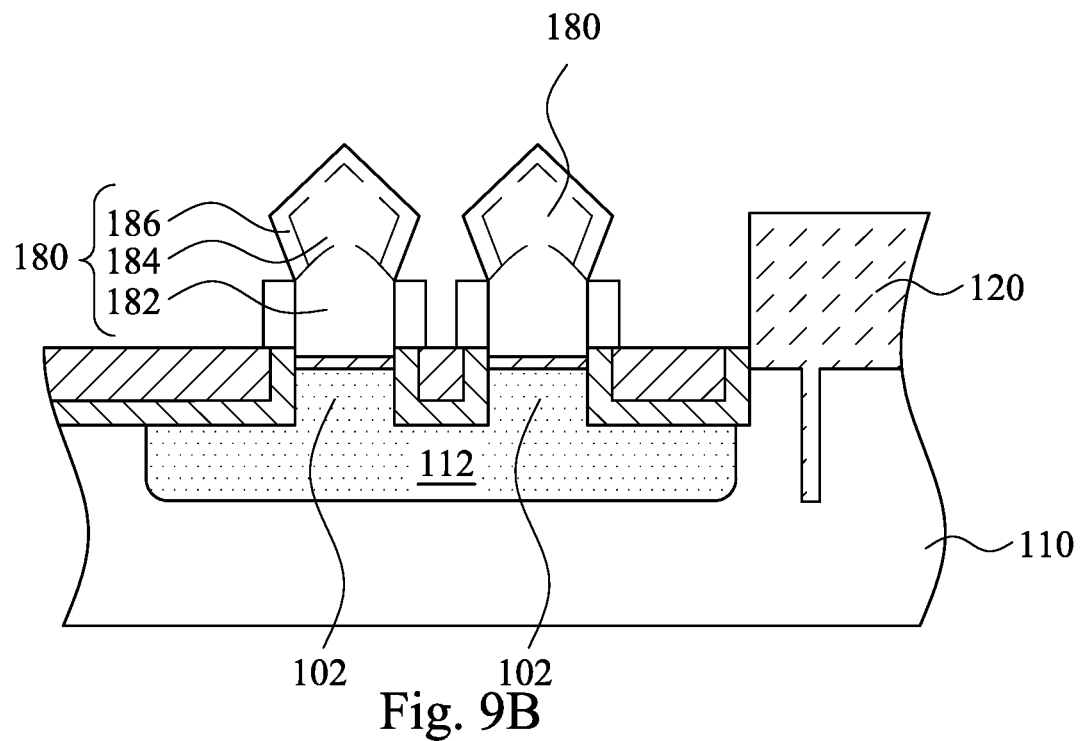
FIG. 9B is a cross-sectional view taking along line B-B of FIG. 9A in some embodiments.
Figure 9C:
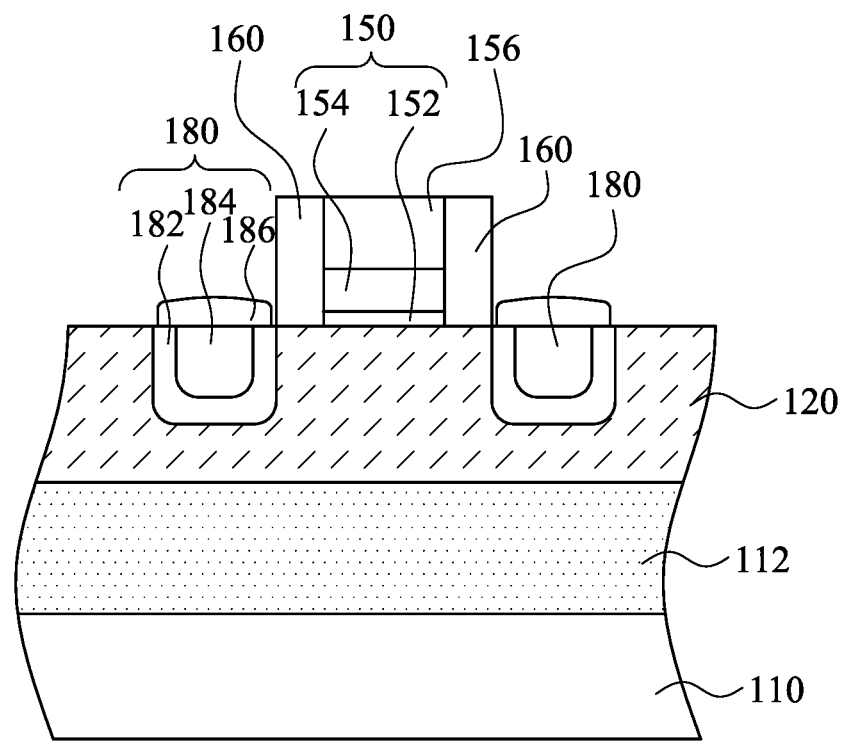
FIG. 9C is a cross-sectional view taking along line C-C of FIG. 9A in some embodiments.

Reference is made to FIGS. 9A to 9C, where FIG. 9B is a cross-sectional view taking along line B-B of FIG. 9A in some embodiments, and FIG. 9C is a cross-sectional view taking along line C-C of FIG. 9A in some embodiments. A plurality of epitaxial structures 180 are formed (or grown) above the recessing trenches 172 (see FIG. 8). The epitaxial structures 180 are formed by epitaxially growing a semiconductor material. The semiconductor material includes single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial structures 180 have suitable crystallographic orientations (e.g., a (100), (110), or (111) crystallographic orientation). In some embodiments, the epitaxial structure 180 includes source/drain epitaxial structure. In some embodiments, where a PFET device is desired, epitaxial structures 180 may include an epitaxially growing silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes.

In some embodiments, the semiconductor device is a PFET device, and the epitaxial structures 180 have facet surfaces. Each facet has a (111) crystallographic orientation. At least one of the epitaxial structures 180 has a plurality portions (i.e., a first portion 182, a second portion 184, and a third portion 186), each of which has different concentrations. For example, if the epitaxial structure 180 is made of SiGe, then the first portion 182 has a Ge concentration ranging from about 10% to about 35%, the second portion 184 has a Ge concentration ranging from about 30% to about 55%, and the third portion 186 has a Ge concentration ranging from about 15% to about 30%, and the claimed scope is not limited in this respect.

Figure 10A:
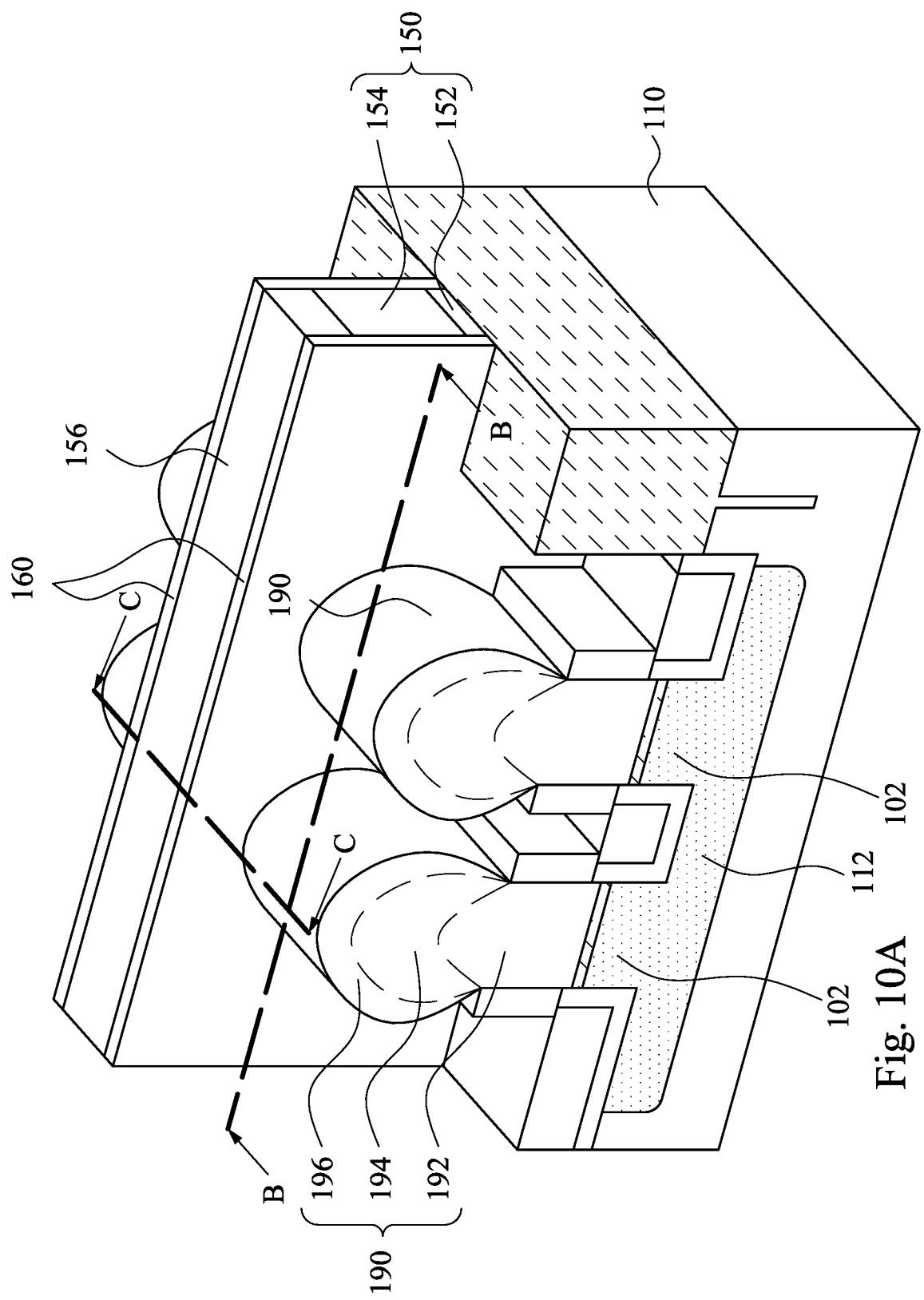
FIG. 10A is a perspective view of a semiconductor device in accordance with some embodiments of the present disclosure.
Figure 10B:
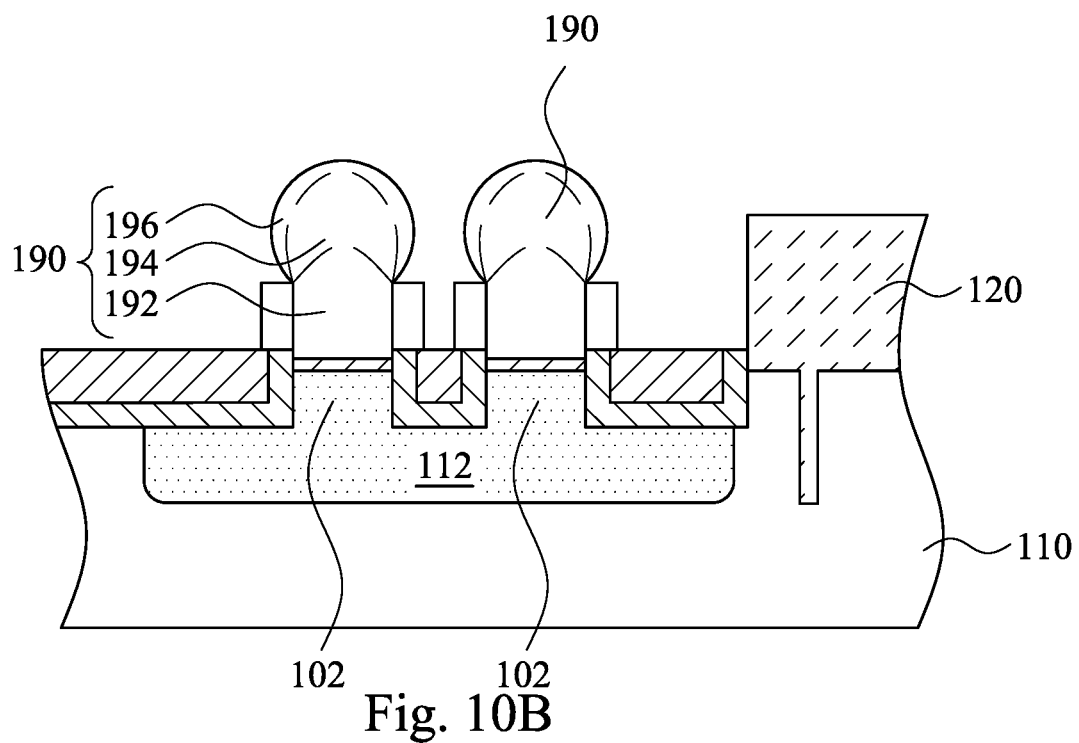
FIG. 10B is a cross-sectional view taking along line B-B of FIG. 10A in some embodiments.
Figure 10C:
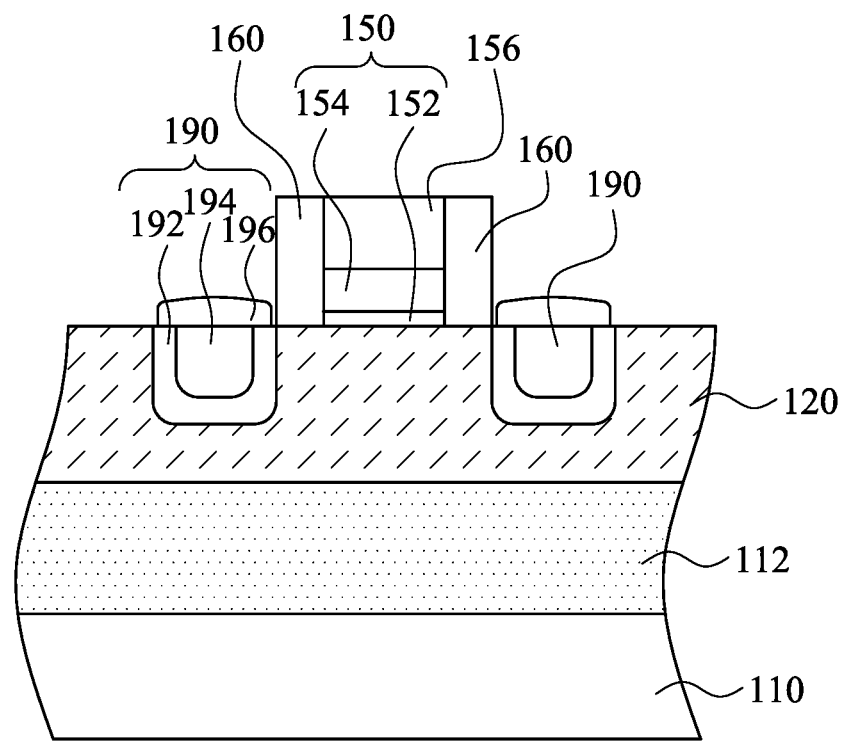
FIG. 10C is a cross-sectional view taking along line C-C of FIG. 10A in some embodiments.

FIG. 10A is a perspective view of a semiconductor device in accordance with some embodiments of the present disclosure, FIG. 10B is a cross-sectional view taking along line B-B of FIG. 10A in some embodiments, and FIG. 10C is a cross-sectional view taking along line C-C of FIG. 10A in some embodiments. The difference between the semiconductor devices of FIGS. 10A and 9A is the epitaxial structures. In FIG. 10A, the semiconductor device is an N-type FET (FET) device, and the epitaxial structures 190 have round surfaces. When the N-type FET (NFET) device is desired, the epitaxial structures 190 may include an epitaxially growing silicon phosphorus (SiP). Furthermore, at least one of the epitaxial structures 190 has a plurality portions (i.e., a first portion 192, a second portion 194, and a third portion 196), each of which has different concentrations. For example, if the epitaxial structures 190 are made of SiP, the first portion 192 has a P concentration ranging from about 7E20 to about 1E21, the second portion 194 has a P concentration ranging from about 1E21 to about 3.5E21, and the third portion 196 has a P concentration ranging from about 7E20 to about 3E21. Since other structure details of the semiconductor device of FIGS. 10A to 10C are similar to FIGS. 9A to 9C, and, therefore, a description thereof is not repeated.

According to the aforementioned embodiments, since the top surface of the substrate is baked after the dry clean process, the number of defects in the top surface is reduced. Because of this low defect level in the top surface, when the epitaxial growth takes place on the substrate, the high quality epitaxial layer can be formed without nucleation of extended defects.

According to some embodiments, a device includes a semiconductor substrate, an isolation structure, and an epitaxial fin portion. The semiconductor substrate has an implanted region. The implanted region has a bottom fin portion thereon, in which a depth of the implanted region is smaller than a thickness of the semiconductor substrate. The isolation structure surrounds the bottom fin portion. The epitaxial fin portion is disposed over a top surface of the bottom fin portion, in which the implanted region of the semiconductor substrate includes oxygen and has an oxygen concentration lower than about 1.E+19 atoms/cm$^3$.

According to some embodiments, a top surface of the isolation structure is in a position higher than an interface between the bottom fin portion and the epitaxial fin portion.

According to some embodiments, the device further includes a liner layer between the isolation structure and the bottom fin portion.

According to some embodiments, the device further includes a liner layer in contact with the implanted region.

According to some embodiments, the epitaxial fin portion and the semiconductor substrate are made of the same material.

According to some embodiments, the device further includes a gate stack extending across the epitaxial fin portion.

According to some embodiments, the device further includes a source/drain epitaxial structure adjoining the epitaxial fin portion.

According to some embodiments, the device further includes a sidewall spacer on a sidewall of a bottom portion of the source/drain epitaxial structure.

According to some embodiments, the epitaxial fin portion has a part interposed between the source/drain epitaxial structure and the bottom fin portion.

According to some embodiments, a width of the implanted region is smaller than a width of the semiconductor substrate.

According to some embodiments, a device includes a semiconductor substrate, an isolation structure, and an epitaxial fin portion. The semiconductor substrate has an implanted region. The implanted region has a bottom fin portion thereon, in which a depth of the implanted region is smaller than a thickness of the semiconductor substrate. The isolation structure surrounds the bottom fin portion. The epitaxial fin portion is disposed over a top surface of the bottom fin portion, in which a bottom surface of the epitaxial fin portion includes oxygen and has an oxygen concentration lower than about 1.E+19 atoms/cm$^3$.

According to some embodiments, the bottom fin portion comprises boron, phosphor, or a combination thereof.

According to some embodiments, the epitaxial fin portion is made of silicon.

According to some embodiments, the device further includes a source/drain epitaxial structure adjoining the epitaxial fin portion.

According to some embodiments, a top surface of the isolation structure is in a position higher than a bottom surface of the source/drain epitaxial structure.

According to some embodiments, a bottom surface of the source/drain epitaxial structure is in contact with the epitaxial fin portion.

According to some embodiments, a width of the implanted region is smaller than a width of the semiconductor substrate.

According to some embodiments, a device includes a semiconductor substrate, an isolation structure, and an epitaxial fin portion. The semiconductor substrate has an implanted region. The implanted region has a bottom fin portion thereon, in which a width of the implanted region is smaller than a width of the semiconductor substrate. The isolation structure surrounds the bottom fin portion. The epitaxial fin portion is disposed over a top surface of the bottom fin portion. The bottom fin portion comprises oxygen and has an oxygen concentration lower than about 1.E+19 atoms/cm$^3$.

According to some embodiments, a depth of the implanted region is smaller than a thickness of the semiconductor substrate.

According to some embodiments, the epitaxial fin portion has a lowest oxygen concentration adjacent an interface between the epitaxial fin portion and the bottom fin portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a fin structure over a substrate, wherein the fin structure comprises:
a bottom portion protruding from the substrate; and
a top portion over the bottom portion, wherein a composition of the bottom portion is different from a composition of the top portion, and an interface between the bottom portion and the top portion comprises oxygen and has an oxygen concentration lower than about $1.E+19$ atoms/cm$^3$;
a gate structure covering the fin structure; and
a first source/drain epitaxial structure and a second source/drain epitaxial structure over the top portion of the fin structure and on opposite sides of the gate structure.

2. The device of claim 1, wherein the bottom portion of the fin structure has an implantation region therein.

3. The device of claim 1, further comprising an isolation structure over the substrate and adjacent to the fin structure.

4. The device of claim 3, wherein a top surface of the isolation structure is higher than the interface between the bottom portion and the top portion.

5. The device of claim 3, wherein a top surface of the isolation structure is higher than an interface between the top portion of the fin structure and the first source/drain epitaxial structure.

6. The device of claim 1, wherein a part of the top portion of the fin structure directly beneath the first source/drain epitaxial structure has a vertical thickness less than a vertical thickness of the bottom portion of the fin structure.

7. The device of claim 1, wherein the top portion of the fin structure is a silicon layer.

8. A device comprising:
a semiconductive fin comprising:
a bottom semiconductive portion; and
a top semiconductive portion covering the bottom semiconductive portion, wherein an oxygen concentration of the top semiconductive portion is greater than an oxygen concentration of the bottom semiconductive portion;
a first source/drain epitaxial structure and a second source/drain epitaxial structure over the top semiconductive portion; and
a gate structure across the semiconductive fin and between the first source/drain epitaxial structure and the second source/drain epitaxial structure.

9. The device of claim 8, wherein a gradient of the oxygen concentration of the top semiconductive portion of the semiconductive fin in a depth direction is higher than a gradient of the oxygen concentration of the bottom semiconductive portion of the semiconductive fin in the depth direction.

10. The device of claim 8, wherein the oxygen concentration of the bottom semiconductive portion of the semiconductive fin is about $1.E+18$ atoms/cm$^3$.

11. The device of claim 8, wherein the oxygen concentration of the top semiconductive portion of the semiconductive fin is lower than about $1.E+21$ atoms/cm$^3$.

12. The device of claim 8, wherein the bottom semiconductive portion of the semiconductive fin has an implantation region therein.

13. The device of claim 8, further comprising sidewall spacers on opposite sides of the first source/drain epitaxial structure.

14. The device of claim 13, wherein the sidewall spacers are spaced apart from the top semiconductive portion of the semiconductive fin.

15. A device comprising:
a substrate comprising a protruding portion;
a gate structure over the substrate and covering the protruding portion;
a first source/drain epitaxial structure and a second source/drain epitaxial structure over the protruding portion of the substrate and on opposite sides of the gate structure; and
a semiconductive layer over the protruding portion of the substrate and extending from beneath the first source/drain epitaxial structure to beneath the second source/drain epitaxial structure, wherein an oxygen concentration of the semiconductive layer decreases in a depth direction of the semiconductive layer.

16. The device of claim 15, wherein the oxygen concentration of the semiconductive layer decreases in the depth direction to about $1.E+18$ atoms/cm$^3$.

17. The device of claim 15, wherein a bottom surface of the semiconductive layer has a lowest oxygen concentration in the semiconductive layer.

18. The device of claim 15, wherein the protruding portion of the substrate comprises P-type or N-type dopants.

19. The device of claim 15, wherein the semiconductive layer is in contact with the protruding portion.

20. The device of claim 15, wherein the semiconductive layer is in contact with the first source/drain epitaxial structure.

* * * * *